United States Patent [19]

Nakayama

[11] Patent Number: 5,620,530
[45] Date of Patent: Apr. 15, 1997

[54] BACK REFLECTOR LAYER, METHOD FOR FORMING IT, AND PHOTOVOLTAIC ELEMENT USING IT

[75] Inventor: Akiya Nakayama, Kyoto, Japan

[73] Assignee: Canon Kabushiki Kaisha, Tokyo, Japan

[21] Appl. No.: 515,296

[22] Filed: Aug. 15, 1995

[30] Foreign Application Priority Data

Aug. 24, 1994 [JP] Japan .................................. 6-199343

[51] Int. Cl.$^6$ ........................... H01L 31/04; H01L 31/18; C23C 14/34
[52] U.S. Cl. ..................... 136/259; 257/436; 428/469; 428/472; 204/192.27; 204/192.29; 438/72
[58] Field of Search .................... 204/192.27, 192.29; 136/259; 257/436; 428/469, 472; 437/2, 4

[56] References Cited

U.S. PATENT DOCUMENTS

| | | | |
|---|---|---|---|
| 4,492,181 | 1/1985 | Ovshinsky | 118/718 |
| 4,532,372 | 7/1985 | Nath | 136/256 |
| 4,598,306 | 7/1986 | Nath | 257/458 |
| 5,101,260 | 3/1992 | Nath et al. | 257/53 |
| 5,221,854 | 6/1993 | Banerjee et al. | 257/431 |
| 5,296,045 | 3/1994 | Banerjee et al. | 136/249 |
| 5,453,135 | 9/1995 | Nakagawa et al. | 136/259 |

FOREIGN PATENT DOCUMENTS

| | | | |
|---|---|---|---|
| 60-41878 | 9/1985 | Japan | 136/246 |
| 6-196736 | 7/1994 | Japan | 136/259 |
| 6-196738 | 7/1994 | Japan | 136/259 |

OTHER PUBLICATIONS

M. Hirasaka, et al., "Design of Textured Al Electrode for a Hydrogenated Amorphous Silicon Solar Cell", Solar Energy Materials, vol. 20, (1990), pp. 99–110.

T. Nakada, et al., "Effect of Water Vapor on the Growth of Textured ZnO–Based Films for Solar Cells by DC–Magnetron Sputtering", Japanese Journal of Applied Physics, vol. 30, (1991), pp. 3344–3348.

*Primary Examiner*—Aaron Weisstuch
*Attorney, Agent, or Firm*—Fitzpatrick, Cella, Harper & Scinto

[57] ABSTRACT

An object of the present invention is to provide a back reflector layer having a texture structure with a high reflectivity by preventing oxidation of a metal or alloy base layer, and a method for forming it. A further object is to provide a photovoltaic element with excellent characteristics such as a conversion efficiency, and a process for fabricating it. The back reflector layer has a metal or alloy (hereinafter referred to as a first metal) base layer, and a transparent oxide of a second metal, formed on the first metal. A photovoltaic element is formed by forming a semiconductor junction on the back reflector layer. In the back reflector layer and the photovoltaic element, the electron affinity of the second metal is at least 0.46 eV smaller than that of the first metal, and the transparent oxide is formed by a sputtering method in an atmosphere comprising at least $H_2O$ and an inert gas and with a target having a composition ratio of the second metal of 1.06 to 1.2 times the stoichiometric composition thereof.

19 Claims, 5 Drawing Sheets

BACK REFLECTOR LAYER, METHOD FOR FORMING IT, AND PHOTOVOLTAIC ELEMENT USING IT

BACKGROUND OF THE INVENTION

1. Field of the Invention

The present invention concerns a back reflector layer, a method for forming it, a photovoltaic element using it, and a process for fabricating the photovoltaic element. Particularly, the invention relates to a back reflector layer having a high reflectivity and an asperity structure (hereinafter referred to as a texture structure), and a photovoltaic element high in performance, high in reliability, and capable of being mass-produced.

2. Related Background Art

At present the energy supply is greatly dependent upon thermal power generation using fossil fuels such as petroleum and coal, and nuclear power generation. However, there is a serious question whether we may continue our energy dependence upon the fossil fuels, which cause global warming because of carbon dioxide etc. produced upon use of the thermal power generation, or upon the nuclear power generation, which involves some danger of radiation not only due to an accident, but also in the course of normal operation. Thus, attention has been drawn to solar-electric power generation using solar cells, which has very little effect on the global environment, and wider use thereof is expected.

There are, however, some problems which hinder widespread use of solar-electric power at present.

Single-crystal or polycrystal silicon have been commonly used heretofore for the solar cells for solar-electric power generation. For such solar cells using single-crystal or polycrystal silicon, the growth of crystals necessitates a lot of energy and time, and complex steps are necessary after the crystal growth. Thus, they are not suitable for mass production, and it is difficult to provide them at a low price. On the other hand, active research and development has been made on the so-called thin-film semiconductor solar cells using amorphous silicon (hereinafter referred to as a-Si) and compound semiconductor such as CdS and $CuInSe_2$. These solar cells can be fabricated simply by forming a necessary thickness of a semiconductor layer on a cheap substrate such as glass or stainless steel, the fabrication steps thereof are relatively simple, and they include a possibility of cost reduction. The thin-film semiconductor solar cells, however, have lower efficiencies of photoelectric conversion than the single-crystal or polycrystal silicon solar cells and are not of sufficient reliability in long-term use. Thus, they are not widely used presently. A variety of ideas as discussed below have been presented in order to solve such problems and to improve the performance of the thin-film semiconductor solar cells. enhancing the reflectivity of light on the surface of substrate in order to cause the light energy (such as sunlight) not absorbed by the thin-film semiconductor for photoelectric conversion to travel back again into the thin-film semiconductor, i.e., in order to more effectively utilize incident light. For this purpose, when the substrate is optically transparent and the sunlight is incident from the substrate side, after formation of the thin-film semiconductor on the substrate an electrode is formed on the surface thereof, using a metal with high reflectivity, such as silver (Ag), aluminum (Al), or copper (Cu). In contrast, when the sunlight is incident from the exposed surface of the thin-film semiconductor, a layer of the same metal as listed above is first formed on the substrate and then the semiconductor layer is formed thereon.

Further, the reflectivity can be further enhanced by the multiple interference effect when a transparent layer having appropriate optical properties is interposed between the metal layer and the thin-film semiconductor layer, for example as shown in FIGS. 6A and 6B. FIGS. 6A and 6B show simulation results to verify that the reflectivity is improved when zinc oxide (ZnO) is interposed as a transparent layer between silicon and a metal selected from the above listed metals: FIG. 6A shows reflectivities when a-Si is formed on the metals; FIG. 6B shows reflectivities when ZnO is formed on the metals and then a-Si is formed on the ZnO.

The use of such a transparent layer is also effective for enhancing the reliability of thin-film solar cells. For example, Japanese Patent Publication No. 60-41878 discloses that use of a transparent layer can prevent the semiconductor and the metal layer from forming an alloy. Also, U.S. Pat. Nos. 4,532,372 and 4,598,306 disclose that use of a transparent layer with an appropriate resistance can prevent an excessive electric current from flowing between the electrodes even if the semiconductor layer has a short-circuited portion.

Another proposal for enhancing the conversion efficiency of solar cells is a method for making fine asperities (texture structure) on the surface of the solar cell and/or an interface between the back reflector layer and the semiconductor layer. With such a structure, the sunlight is scattered by the surface of solar cell and/or the interface between the back reflector layer and the semiconductor layer and further is confined inside the semiconductor (light trapping effect), whereby the sunlight can be effectively absorbed by the semiconductor. For example, when a transparent substrate is used and the sunlight is incident from the transparent substrate side, a good result can be obtained by texturing the surface of the transparent electrode such as tin oxide ($SnO_2$) on the substrate. When the sunlight is made incident from the surface of the thin-film semiconductor, a good result can be obtained by texturing the surface of the metal layer used as the back reflector layer.

M. Hirasaka, K. Suzuki, K. Nakatani, M. Asano, M. Yano, and H. Okaniwa disclose that the texture structure for back reflector layer can be obtained by depositing Al while adjusting the temperature of the substrate and the deposition rate (*Solar Cell Materials*, Vol. 20 (1990) pp. 99–110). FIG. 7 shows an example in which absorption of incident light increases by use of the back reflector layer in such a texture structure. In FIG. 7, curve (a) represents the spectral sensitivity of an a-Si solar cell using a flat Ag layer as the metal layer, whereas curve (b) represents the spectral sensitivity of an a-Si solar cell fabricated in the same manner except that the Ag layer is formed in the texture structure.

One of the methods for obtaining the texture structure of the transparent layer involves introducing water vapor into the discharge gas used during layer formation ("Effect of Water Vapor on the Textured ZnO-Based Films for Solar Cells by DC-Magnetron Sputtering", by Tokio Nakada, Yukinobu Ohkubo and Akio Kunioka, *Japanese Journal of Applied Physics*, Vol. 30 No. 12A, December, 1991, pp. 3344–3348). Observation by SEM confirmed that the texture structure was more developed by depositing a metal oxide on a glass plate while introducing water vapor than by using Ar gas as the discharge gas. Although the conventional technology required a thick film in order to obtain the necessary texture structure for improving the characteristics of the solar cell, this method made it possible to decrease the film thickness.

It was, however, found that the solar cells using the back reflector layer obtained by forming a transparent layer on a metal layer by introducing water vapor failed to show the expected improvement of characteristics, or on the contrary, the characteristics, for example, the conversion efficiency, could be lower.

As described above, although at present there is a possibility of producing high-performance solar cells at low cost, they are not available for practical use as yet.

SUMMARY OF THE INVENTION

An object of the present invention is to provide a back reflector layer which comprises a transparent and electrically conductive film with the texture structure formed on a metal or alloy base layer, and a method for producing it. A further object of the invention is to provide a photovoltaic element with excellent characteristics such as conversion efficiency, and a process for fabricating it.

The back reflector layer of the present invention is a back reflector layer having a metal or alloy layer (hereinafter referred to as a first metal), and a transparent oxide comprising a second metal and formed on the first metal, wherein the electron affinity of the second metal is at least 0.46 eV smaller than that of the first metal and wherein the transparent oxide is formed by a sputtering method in an atmosphere comprising at least $H_2O$ and an inert gas and with a target having a composition ratio of the second metal of 1.06 to 1.2 times the stoichiometric composition thereof.

The film thickness of the transparent oxide of the second metal is preferably between 5 nm and 20 nm, and a second transparent oxide is preferably further formed on the transparent oxide by a sputtering method using a target with a composition ratio of the second metal of 0.96 to 1.04 times the stoichiometric composition thereof.

A photovoltaic element of the present invention comprises a semiconductor junction formed on the above back reflector layer.

The method for forming the back reflector layer is one in which on a metal or alloy layer (hereinafter referred to as a first metal) there is formed a transparent oxide of a second metal having an electron affinity at least 0.46 eV smaller than that of the first metal, wherein the transparent oxide is formed by a sputtering method in an atmosphere comprising at least $H_2O$ and an inert gas and with a target having a composition ratio of the second metal of 1.06 to 1.2 times the stoichiometric composition thereof.

The film thickness of the transparent oxide is preferably between 5 nm and 20 nm, and another transparent oxide is preferably formed thereover after formation of the above transparent oxide, using a target having a composition ratio of the second metal of 0.96 to 1.04 times the stoichiometric composition thereof.

In the present invention, $O_2$ gas is preferably added into the above atmosphere.

The process for fabricating the photovoltaic element of the present invention is characterized by formation of a semiconductor junction after formation of the above back reflector layer. This process can form a photovoltaic element having excellent characteristics.

DETAILED DESCRIPTION OF THE PREFERRED EMBODIMENTS

Figure 1A:
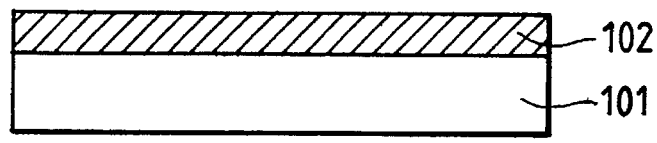
FIGS. 1A–1C are diagrammatic cross-sectional views showing an example of the steps for fabricating the photovoltaic element of the present invention.

By extensively and intensively studying the relation between the film-forming conditions of the transparent layer and the characteristics of photoelectric conversion element, the present inventor found the following problems when a back reflector layer comprising a transparent and electrically conductive layer having a texture structure was formed on a metal layer, using $H_2O$ as a reactive gas. In more detail, when a metal oxide layer was formed by sputtering in an atmosphere containing $H_2O$, the texture was developed in even smaller thicknesses than when the discharge gas included only an inert gas such as Ar, but the inventor observed a tendency that the base layer, the metal or alloy film, was oxidized. It was found that this oxidation lowered the reflectivity, resulting in lowering the function of the back reflector layer.

The most significant cause of this oxidation is conceivably that when the $H_2O$ gas or $O_2$ gas as a reactive gas or a discharge gas is exposed to discharge, reactive oxygen is produced which oxidizes the metal or alloy film base. As the metal or alloy base layer is a material more easily oxidized, it becomes more subject to oxidation.

Namely, when the transparent oxide layer having the texture structure is formed by the sputtering method, the metal or alloy base layer is subjected to oxidation by the $H_2O$ or $O_2$ gas in the discharge atmosphere.

The inventor of the present application found out after intensive and extensive studies that the transparent oxide with asperity was capable of being formed while preventing the oxidation of the metal or alloy base layer upon sputtering if a metal having an electron affinity at least 0.46 eV smaller than that of the metal base layer (first metal) was selected as the metal (second metal) composing the transparent oxide and if the transparent oxide was formed using a target containing the second metal in an amount 1.06 to 1.2 times more than the stoichiometric composition of the transparent oxide.

This effect is considered as due to the difference in electron affinity between the metal elements. The electron affinity is defined as follows. When an atom or molecule A is coupled with an electron to form a negative ion, the energy released at that time is defined as the electron affinity of A. Electrons become easier to remove when this energy (electron affinity) becomes smaller than that of another atom or molecule. Accordingly, by using a sputtering target having a greater content of the second metal than the stoichiometric composition of the transparent oxide layer, the transparent oxide layer is formed with an excessive amount of the second metal component. Thus, even if the metal base layer is oxidized upon sputtering, the excess second metal in the metal oxide deposited thereon can deprive the metal base layer of oxygen. Or, it is considered that the excess second metal is oxidized before oxidation of the metal base layer, thereby preventing oxidation of the metal base layer.

Particularly, in applications as a photovoltaic element, to small an excess amount of the metal in the transparent oxide layer or too small a film thickness will result in insufficient "antioxidation" or in contrast, too great an excess amount of the metal or too large a film thickness will lower the transmittance, thus decreasing the reflectivity. Therefore, the sputtering target used in forming the transparent oxide is required to have a metal composition ratio of 1.06 to 1.2 times the stoichiometric composition.

Figure 1B:
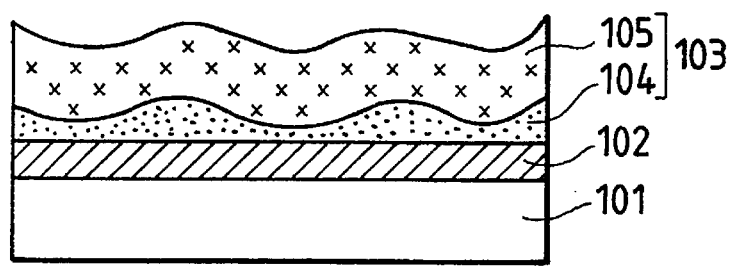
Figure 1C:
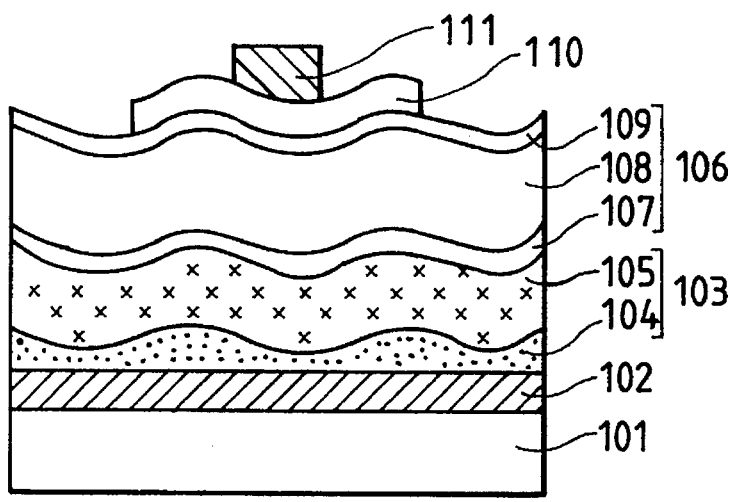

Next described by reference to the drawings is a method for fabricating the back reflector layer and the photovoltaic element of the present invention. FIGS. 1A–1C are diagrammatic drawings showing fabrication steps of the photovoltaic element of the present invention.

Metal Layer 102

In FIGS. 1A–1C, reference numeral 101 designates a substrate, and a layer 102 of a metal with high reflectivity is formed on the surface of the substrate. If the substrate 101 itself is made of an electrically conductive material having a sufficiently high reflectivity, the metal layer 102 may be omitted. Here, at least the surface of the metal layer 102 is preferably formed as a flat surface in order to enhance the reflectivity (FIG. 1A).

Transparent Oxide Layer 103

A transparent oxide layer 103 having fine asperities on the surface is formed on the metal layer 102. This example shows a case of ZnO being used as the transparent oxide layer 103. In this example the transparent oxide layer 103 is composed of first and second transparent oxide layers, which are a metal oxide layer (first transparent oxide layer) 104, formed using an excess metal sputtering target (Zn+ ZnO), and a metal oxide layer (second transparent oxide layer) 105, formed using a ZnO sputtering target.

Figure 2:
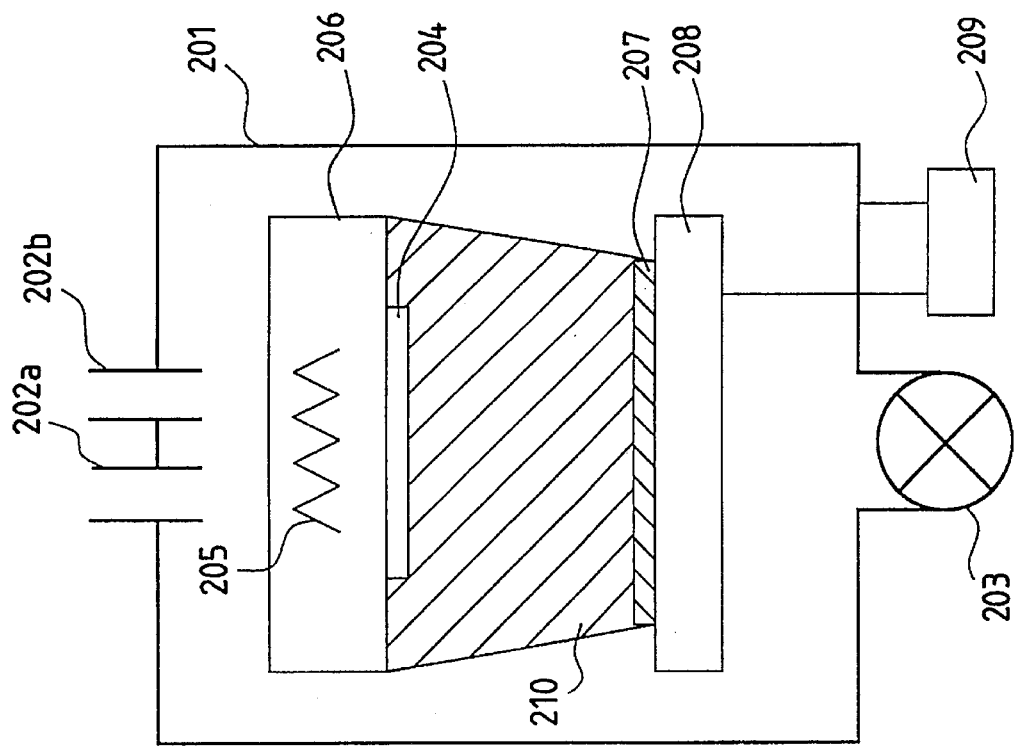
FIG. 2 is a diagrammatic drawing showing an example of a sputtering apparatus suitable for fabrication of the back reflector layer of the present invention.

A method is now described for forming the transparent oxide layer 103, using the DC magnetron sputtering apparatus shown in FIG. 2. In FIG. 2, reference numeral 201 designates a deposition chamber, which is evacuated by an exhaust pump not shown. Inside the deposition chamber, $H_2O$ and an inert gas such as argon (Ar) are introduced at predetermined flow rates to realize a desired mixture ratio thereof through gas inlet pipes 202a, 202b connected to gas tanks not shown, and the opening of exhaust valve 203 is adjusted to keep the inside of the deposition chamber 201 at a predetermined pressure. A substrate 204 having the flat metal layer 102 on the surface thereof is fixed to the surface of anode 206 in which a heater 205 is installed. Opposed to the anode 206 is a cathode electrode 208, to the surface of which a target 207 is fixed and inside which a magnet (not shown) is provided. The target 207 is, for example, zinc oxide containing 56% of zinc. A power supply 209 applies a high voltage directed current (DC) to the cathode electrode 208 to produce a plasma 210 between the cathode and the anode. This plasma 210 generates reactive oxygen, which temporarily oxidizes the metal layer 102. However, ZnO and Zn from the target 207 as the second metal with an electron affinity at least 0.46 eV smaller than that of the first metal used in the metal layer 102, are deposited on the substrate 204, and the thus deposited Zn as the second metal deprives the oxidized metal layer 102 of oxygen, to thereby reduce the metal layer 102. Accordingly, the metal layer 102 maintains a high reflectivity, and the oxide of the second metal serves as the first transparent oxide layer.

Next, after deposition of the first transparent oxide, the target is changed to a ZnO target, for example, containing 50% zinc, and a second transparent oxide layer is deposited on the first transparent oxide layer. In the thus obtained photovoltaic element in the form shown in FIG. 1, the transparent oxide 103 is transparent to light energy transmitted by the photovoltaic semiconductor layer. Further, it has an appropriate electric resistance and the surface thereof is of the texture structure. Particularly, use of water vapor as a reactive gas develops the texture structure in the same film thickness more than in the case of a discharge gas containing only inert gas such as Ar (FIG. 1B).

Photovoltaic Semiconductor Layer 106

Next, a photovoltaic semiconductor layer 106 is formed on the transparent oxide 103. FIG. 1C shows an example of the use of a pin-type a-Si semiconductor as a semiconductor junction. Namely, reference numeral 107 is an n-type a-Si semiconductor, 108 an i-type a-Si semiconductor, and 109 a p-type a-Si semiconductor. The photoelectric conversion layer may also be formed using a pn junction or Schottky barrier as the semiconductor layer 106. Instead of the a-Si semiconductor, the semiconductor 106 may be formed using microcrystalline silicon (μ-Si), a-SiGe, a-SiC, A-SiSn, a-SiN, a-SiO, μ-SiGe, μ-SiC, μ-SiSn, μ-SiN, μ-SiO, etc., or a combination thereof with the respective conductivity types. The method for forming the semiconductor may be selected from a variety of methods including the RFCVD process, the MWCVD process, the photo-assisted CVD process, the thermal CVD process, the sputtering process, the ion plating process, etc. If the semiconductor 106 is thin enough, the entire semiconductor junction layer often shows the texture structure similar to the transparent oxide layer 103, as shown in FIG. 1C.

Transparent Electrode 110

As shown in FIG. 1C, a transparent electrode 110 such as ITO or $SnO_2$ is used when the light is incident from the side opposite the substrate.

Further, in order to improve electron collection, a collector electrode 111, a bus-bar, or the like may be provided in a desired shape (for example, in a comb shape).

The photovoltaic element fabricated by the above procedures has the following advantages.

(1) By reducing the oxidation of the surface of the metal layer 102, the reflectivity of light at the metal surface can be maintained as high as the original reflectivity of the metal layer 102. In addition, the surface of the transparent oxide layer 103 (and semiconductor junction 106) is shaped in the well developed texture structure even in a thin film thickness as compared with the case using only the Ar gas, thus enhancing the light trapping effect in which the semiconductor serves as a kind of waveguide tube inside the semiconductor junction 106. Thus, incident light energy is effectively absorbed so as to improve the conversion efficiency of the solar call as a photoelectric conversion element.

(2) Since the surface of the metal layer 102 (or the substrate 101 itself) is flat, the area of contact with the transparent oxide layer 103 decreases, which reduces diffusion or the like of the second metal atoms into the transparent oxide layer 103, thereby maintaining the high reflectivity of the metal layer 102.

(3) Since the transparent oxide layer 103 is provided with an appropriate resistance even if the target 207 for forming the transparent oxide contains atoms of the second metal in an amount 1.06 to 1.2 times the stoichiometric composition, no excessive electric current flows even if the semiconductor has a defect such as a pinhole.

Experiments which were performed in order to show the operational effects of the present invention are now explained in more detail.

EXPERIMENT 1

On a glass substrate of 5 cm×5 cm a transparent oxide was deposited in a thickness of 400 nm by the DC magnetron sputter process in an atmosphere of Ar gas and/or $H_2O$ (50 sccm) and with a target of zinc oxide (Zn:O=56:44, 1.12 times the stoichiometric composition). In order to observe the texture structure of the transparent layer, a scanning probe microscope (Nano Scope III manufactured by Desital Instruments Co.) was used to obtain a texture degree (average height of differences between crests and valleys). The results are shown in Table 1.

TABLE 1

| $Ar:H_2O$ (%) | 100:0 | 90:10 | 80:20 | 70:30 | 60:40 |
|---|---|---|---|---|---|
| Texture Degree (nm) | 68 | 75 | 95 | 300 | 320 |
| $Ar:H_2O$ (%) | 50:50 | 40:60 | 20:80 | 0:100 | — |
| Texture degree (nm) | 322 | 323 | 324 | 325 | — |

It is seen from Table 1 that the texture degree increases as the ratio of $H_2O$ in the $Ar+H_2O$ atmosphere increases. This confirms that introduction of $H_2O$ is effective to improve the texture structure.

EXPERIMENT 2

Using a SUS plate of 5 cm×5 cm instead of the glass substrate, Ag was deposited in 60 nm thickness on the SUS plate, and thereafter the transparent oxide was formed in the same manner as in Experiment 1. Then the texture degree was measured using the scanning probe microscope, and the reflectivity was also measured using a reflection spectroscope (U 4000 type automatic luminous intensity spectrophotometer manufactured by Hitachi, Ltd.) with Ag being a standard. The results are shown in Table 2.

TABLE 2

| $Ar:H_2O$ (%) | 100:0 | 90:10 | 80:20 | 70:30 | 60:40 |
|---|---|---|---|---|---|
| Texture Degree (nm) | 80 | 92 | 106 | 320 | 340 |
| Total reflectivity (%) | 90 | 78 | 62 | 58 | 49 |
| Irregular reflectivity (%) | 20 | 15 | 8 | 32 | 33 |
| $Ar:H_2O$ (%) | 50:50 | 40:60 | 20:80 | 0:100 | — |
| Texture degree (nm) | 342 | 343 | 344 | 345 | — |
| Total reflectivity (%) | 49 | 45 | 44 | 41 | — |
| Irregular reflectivity (%) | 34 | 34 | 32 | 31 | — |

The total reflectivity indicates the intensity of light reflected in all directions relative to the intensity of incident light, and the irregular reflectivity indicates the intensity of reflected light except for the light in the directions of reflecting angles relative to the intensity of incident light.

The texture degree increased as the rate of $H_2O$ increased, similarly as in the results of Experiment 1, but the total reflectivity decreased with increase of $H_2O$. Samples were etched with acetic acid to observe the Ag surface. The observation confirmed that the Ag surface was oxidized to turn black. From this, it is seen that $H_2O$ in the discharge gas is activated by discharge to promote oxidation of the Ag surface. The metal layer continues turning black with introduction of $H_2O$. The texture degree is not so large until the ratio of 80:20. The texture degree steeply increases from the ratio of 70:30 and then saturates soon, thus decreasing the irregular reflectivity.

EXPERIMENT 3

Ag was deposited in a thickness of 60 nm on a SUS plate of 5 cm×5 cm, and then a first transparent oxide layer was deposited in a thickness of 10 nm on the Ag layer, and changing the composition ratio of ZnO in the sputtering target as listed in Table 3 as a countermeasure to prevent the oxidation of Ag observed in Experiment 2. Subsequently, a second transparent oxide was formed thereon in a thickness of 1000 nm in the same manner as in Experiment 2. Results are shown in Table 3. Here, the composition ratios of the targets are results of measurement by XMA (energy dispersive x-ray analyzer EMAX-5770 manufactured by Horiba Seisakusho). Also, R in the table represents the ratio of Zn composition in the target relative to the stoichiometric composition.

TABLE 3

|  | (a) | (b) | (c) | (d) |
|---|---|---|---|---|
| Composition of Target (%) | 50:50 | 53:47 | 56:44 | 60:40 |
| R | 1.0 | 1.06 | 1.12 | 1.2 |
| Total reflectivity (%) | 49 | 75 | 92 | 72 |

|  | (e) | (f) | (g) | (h) |
|---|---|---|---|---|
| Composition of Target (%) | 70:30 | 80:20 | 90:10 | 100:0 |
| R | 1.4 | 1.6 | 1.8 | 2.0 |
| Total reflectivity | 43 | 18 | 2 | 0 |

From Table 3 it is seen that as the Zn component increases in the target, the total reflectivity increases and then decreases. Particularly, high reflectivities are obtained in the range of R being 1.06 to 1.2.

EXPERIMENT 4

Table 4 shows results obtained for changes of the film thickness of the first transparent oxide using the condition (c) in Experiment 3, i.e., using the target with composition of 56:44 (R=1.12).

TABLE 4

| Film thickness (nm) | 0 | 1 | 2 | 5 | 10 | 20 | 30 |
|---|---|---|---|---|---|---|---|
| Total reflectivity (%) | 49 | 54 | 68 | 81 | 92 | 78 | 45 |

From Table 4, it is seen that the total reflectivity was very high when the first transparent oxide had a film thickness of at least 2 nm. This assures that the first transparent oxide is effectively functioning as an antioxidation layer if the film thickness is not less than 2 nm. With a further increase in film thickness, the metallic color of Zn increases, thereby decreasing the reflectivity. It is thus seen that the Zn+ZnO layer for antioxidation of the Ag layer needs to be used in an appropriate range of film thickness because of its properties. As apparent from the table, the film thickness of the first transparent oxide is more preferably 5–20 nm.

EXPERIMENT 5

On a SUS plate of 5 cm×5 cm, the metal layer was formed in a thickness of 60 nm using each of Al, Cu, and Ag as listed in Table 5, and a first transparent oxide layer of each of ZnO, $In_2O_3$, and $SnO_2$ (R=1.12) was formed at a temperature 400° C. and a film thickness of 10 nm on the metal layer. The reflectivity was measured using the various types of back reflector layers. The results are also shown in Table 5. In the table, ○ represents a total reflectivity of not less than 70% while x represents a total reflectivity of less than 70%.

TABLE 5

| | | Transparent oxide | | |
|---|---|---|---|---|
| | | Zn + ZnO | In + $In_2O_3$ | SN + $SnO_2$ |
| Metal layer | Al | ○ | X | X |
| | Cu | ○ | ○ | X |
| | Ag | ○ | ○ | X |

TABLE 6

| Atomic number | 13 | 29 | 47 | 30 | 49 | 50 |
|---|---|---|---|---|---|---|
| Element | Al | Cu | Ag | Zn | In | Sn |
| Electron affinity (eV) | 0.46 | 1.226 | 1.303 | ~0 | 0.30 | 1.25 |

TABLE 7

| | B | | |
|---|---|---|---|
| A | Zn | In | Sn |
| Al | 0.46 | 0.16 | −0.79 |
| Cu | 1.226 | 0.926 | −0.024 |
| Ag | 1.303 | 1.003 | 0.053 |

From Table 5, it is seen that when the transparent oxide is Zn, each of the metal layers of Al, Cu, and Ag showed high reflectivity; when the metal of the transparent oxide was In, only when the metal layer was Ag or Cu was high reflectivity obtained. When the metal of the transparent oxide was Sn, the total reflectivity was less than 70% with the metal layer of Al, Cu, or Ag.

Table 6 shows electron affinities of the respective elements listed (from Revised Third Edition of Handbook of Chemistry, Foundations II, compiled by the Chemical Society of Japan and published by Maruzen). Further, Table 7 shows values indicating differences, E (A)−E(B), in electron affinity between the metals used in the metal layer and the metals used in the transparent oxide layer.

From comparison of Table 5 with Table 7, it is seen that good characteristics as a back reflector layer are achieved (i.e. total reflectivity of not less than 70%) when the difference of electron affinities, E(A)−E(B), is at least 0.46 eV.

EXPERIMENT 6

On a stainless steel plate (SUS 430) of 5 cm×5 cm Ag was deposited in a thickness of 60 nm by the DC magnetron sputtering process. The temperature of the substrate was room temperature. On the Ag layer the transparent oxide was deposited in a thickness of 400 nm at a substrate temperature of 150° C. and in an Ar gas atmosphere by the DC magnetron sputtering method using a target of zinc oxide (ZnO). Subsequently, on the back reflector layer, an a-Si layer with n-type conductivity was deposited in a thickness of 20 nm using raw material gases of $SiH_4$ and $PH_3$, an s-SiGe layer with i-type conductivity was deposited in a thickness of 400 nm using raw material gases of $SiH_4$ and $GeH_4$, and a microcrystalline (μc) Si layer with p-type conductivity was deposited in a thickness of 10 nm with raw gases of $SiH_4$, $BF_3$, and $H_2$, in the named order by the glow discharge decomposition method to form a PIN type semiconductor junction. (Since a-Si formed by the glow discharge decomposition of $SiH_4$ etc. includes about 10% of hydrogen (H), it is generally expressed as a-Si:H; but for simplicity, it is described as a-Si in the description of the present application.) On this semiconductor an ITO film was deposited as a transparent electrode in a thickness of 65 nm by the resistance heating evaporation method. Further, on the ITO film a collector electrode was formed of a silver paste in a width of 300 μm. This cell was called Sample 6a.

Sample 6b was prepared in the same manner as Sample 6a except that the film thickness of the transparent oxide was 800 nm. Further, Samples 6c and 6d were prepared in the same manner as Samples 6a and 6b except that the discharge gas was Ar and $H_2O$ at a ratio of 1:1.

In addition, Samples 6e and 6f were prepared in the same manner as Samples 6c and 6d by depositing the first transparent oxide layer in a thickness of 10 nm by the DC magnetron sputter method in an atmosphere of Ar and $H_2O$ at a ratio of 1:1 and with the Zn+ZnO target (Zn:O=56:44) and then depositing the second transparent oxide layer in thicknesses or 390 nm and 790 nm, respectively, by the DC magnetron sputter method in an atmosphere of Ar and $H_2O$ at a ratio of 1:1 and with the ZnO target.

The thus obtained samples were subjected to measurement of solar cell characteristics under the solar simulator of AM-1.5. The results are shown in Table 8.

TABLE 8

| | Target | Discharge gas | Film thickness (nm) | Current value (A) | Efficiency (%) |
|---|---|---|---|---|---|
| 6a | ZnO | Ar | 400 | 20.6 | 8.1 |
| 6b | ZnO | Ar | 800 | 22.1 | 9 |
| 6c | ZnO | Ar + $H_2O$ | 400 | 21.2 | 8.3 |
| 6d | ZnO | Ar + $H_2O$ | 800 | 22.9 | 9.2 |
| 6e | Zn + ZnO | Ar + $H_2O$ | 400 | 22.6 | 8.9 |
| 6f | Zn + ZnO | Ar + $H_2O$ | 800 | 23.5 | 9.6 |

From comparison between Samples 6a and 6c or between Samples 6b and 6d, it is considered that with introduction of $H_2O$ the texture structure developed to improve the reflectivity, thereby resulting in improving the current value as compared with the cases where the discharge gas included only Ar. Further, as apparent from the relation between Samples 6c and 6e or the relation between Samples 6d and 6f, it is seen that formation of the first transparent oxide layer further improves the current value, thereby improving the efficiency.

The back reflector layer in the photovoltaic element of the present invention is next explained in more detail.

Substrate 101 and Metal Layer 102

A variety of metals can be used as the substrate 101. Among them, a stainless steel plate, a galvanized iron sheet, an aluminum plate, a cooper plate, and the like are preferred because of their relatively low cost. These metal plates may be used in a given shape or in the form of an elongated sheet depending upon the thickness of the plate. In the case of the sheet form, because the sheet plate can be rolled in a coil form, it is well adapted to continuous production and facilitates storage and transportation. Depending upon the application, the substrate may be a crystal substrate of silicon, etc., a glass or ceramic plate, or a plate of a resin, etc. The surface of the substrate may be ground, but it may be used without grinding if the finish is acceptably fine, for example like a stainless steel plate treated by bright annealing.

Figure 6A:
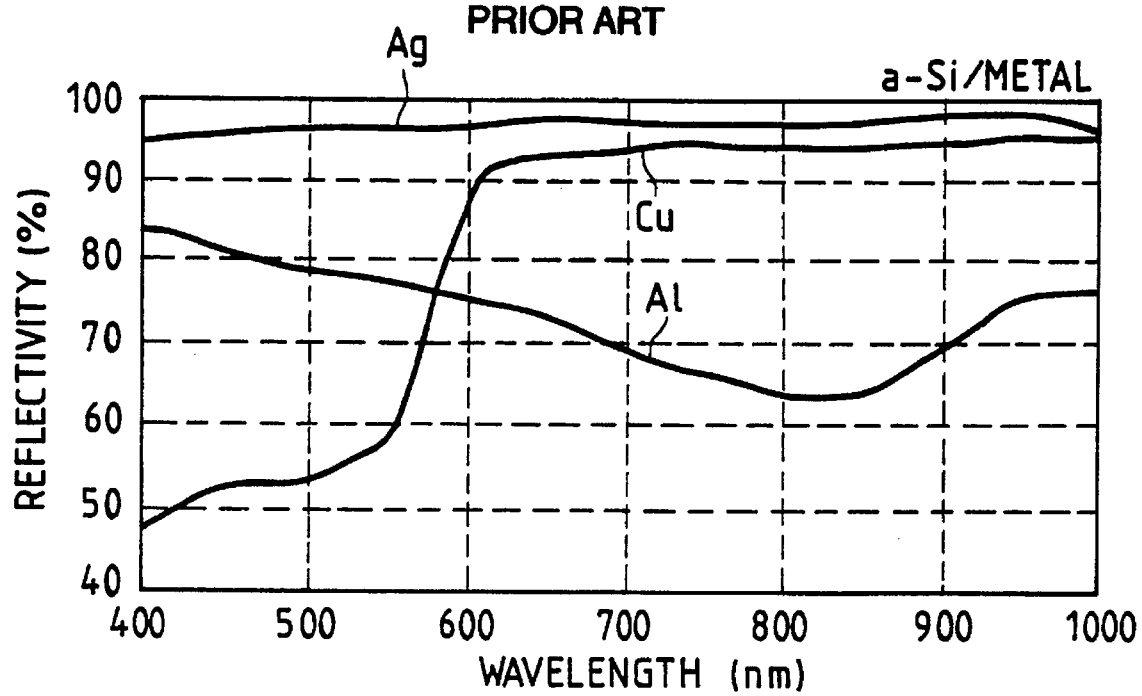
FIGS. 6A and 6B are graphs showing the effect of ZnO on the reflectivity at the interface between silicon and various metals.
Figure 6B:
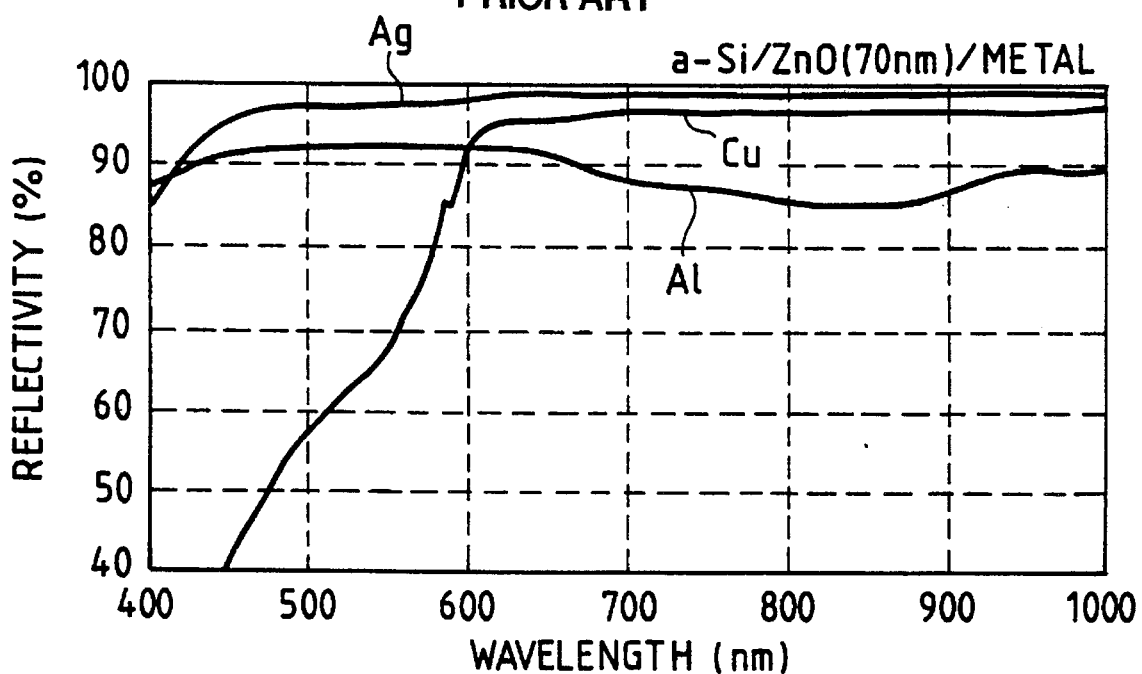
Figure 7:
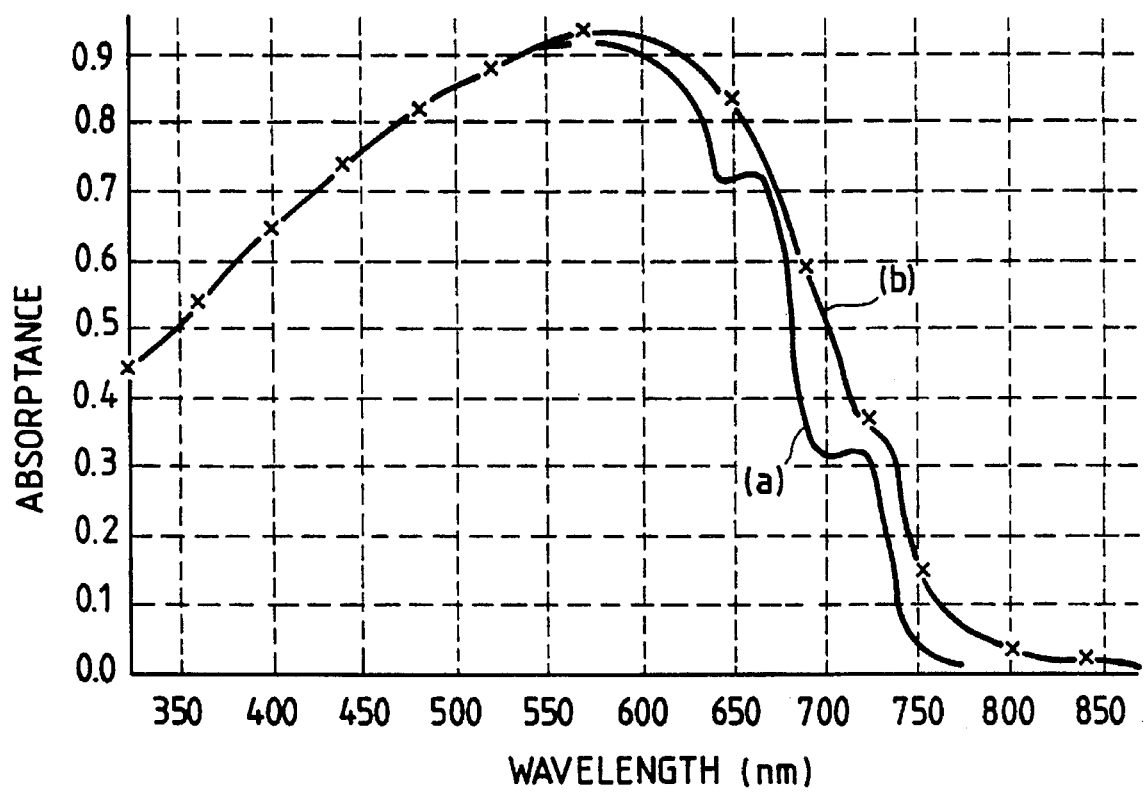
FIG. 7 is a graph showing an improvement in spectral sensitivity of solar cells by the texture structure.

If the substrate is one with low reflectivity of light when untreated, for example like the stainless steel plate or galvanized iron sheet, or an insulating substrate such as glass, it is preferably used after depositing a metal with high reflectivity such as silver, aluminum, or copper on the substrate. However, in the case of its use as a back reflector layer, since short wavelength components in the spectrum of incident light such as sunlight have already been absorbed by the semiconductor, it is a sufficient condition that the reflectivity be high for the light of longer wavelengths than those. The wavelength to be determined as a border for high reflectivities depends upon the light absorption coefficient and the film thickness of the semiconductor used. For example, in the case of a-Si of thickness of 400 nm, the border wavelength is about 600 nm, and thus, copper can be used (FIGS. 6A and 6B). Further, even materials with low electric conductivity, like glass or ceramics, can be used as the substrate by forming a metal layer thereon.

Figure 3:
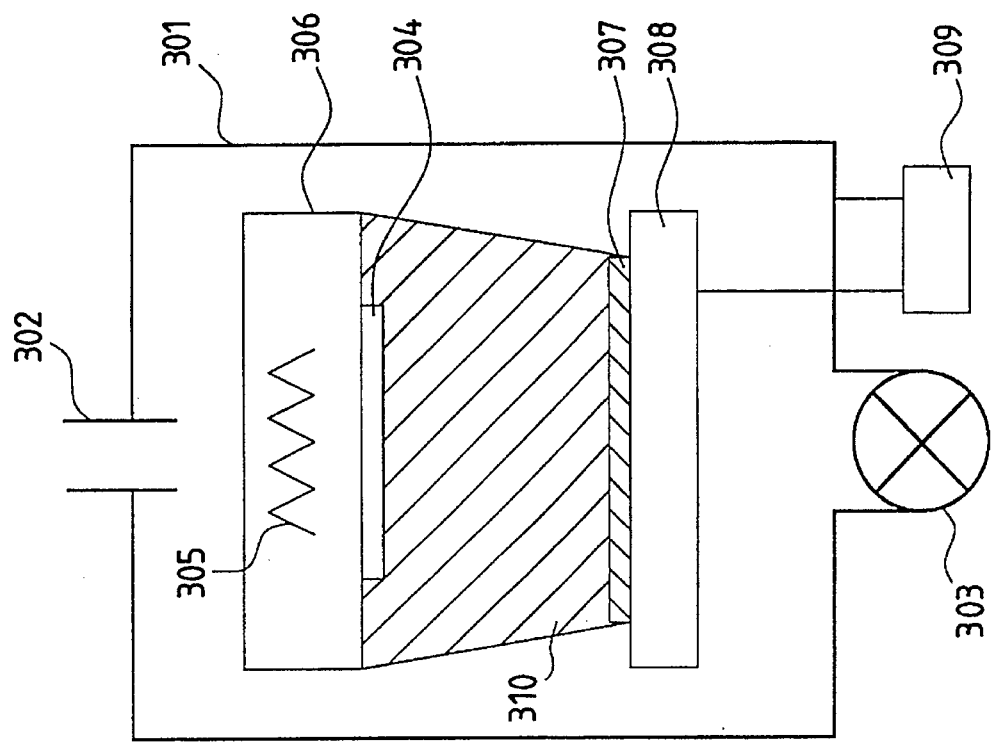
FIG. 3 is a diagrammatic drawing showing another example of a sputtering apparatus suitable for fabrication of the back reflector layer of the present invention.

Deposition of the metal layer can be effected by a method selected from the vacuum deposition methods by resistance heating or electron beam, the sputtering method, the ion plating method, the various CVD methods utilizing plasma, light, and thermal energy, the plating method, etc. As an example of a suitable film-forming method, the sputtering method is explained. FIG. 3 shows an example of a sputtering apparatus. Reference numeral 301 designates a deposition chamber, which is evacuated by an exhaust pump (not shown). Inside this chamber, an inert gas such as argon (Ar) is introduced at a predetermined flow rate through a gas inlet pipe 302 connected to a gas tank (not shown), and the opening of exhaust valve 303 is adjusted to keep the inside of the deposition chamber 301 at a predetermined pressure. The substrate 304 is fixed to the surface of anode 306, inside which a heater 305 is provided. A cathode electrode 308, to the surface of which a target 307 is fixed, is arranged opposed to the anode 306. The target 307 is a block of a metal to be deposited. It is normally a pure metal having a purity of about 99.9% to about 99.999%, but a specific impurity may be introduced thereinto as desired. The cathode electrode is connected to a power supply 309. The power supply 309 applies a high voltage of radio frequency (RF) or direct current (DC) to produce a plasma 310 between the cathode and the anode. This plasma causes metal atoms of the target 307 to be deposited on the substrate 304. The deposition rate can be enhanced by use of a magnetron sputtering apparatus with increased plasma intensity by placing a magnet inside the cathode 308.

Transparent Oxide 103 Layer and Texture Structure thereof

A method of forming the transparent oxide film with fine asperities on the surface thereof is next explained with respect to zinc oxide, referring to FIG. 2. Candidate target compositions include targets having a percentage of the metal component of zinc oxide of 48% to 52% (R=0.96 to 1.04) and targets having a percentage of the metal component of zinc oxide of 53% to 60% (R=1.06 to 1.2).

The former targets can be fabricated by the usual method, but the latter targets require a change of the fabrication conditions. Specifically, hot pressing is conducted at high temperature in an Ar atmosphere for a ling time period, thereby increased in the percent of the metal component. In another method, a reducing gas such as CO may be introduced into the atmosphere, and in that case, the percent of the metal component can be changed by controlling the amount of the reducing gas. In using either of the two types of targets, the film-forming conditions of the transparent oxide are different more or less depending upon whether the power supply is of RF or of DC, whether the magnet behind the target is present or absent, the strength of the magnetic field if the magnet is used, the distance between the substrate and the target, etc. Generally, in the former (Zn=48 to 52%) case, the amount of sputtering power per unit area of the target is 0.5–5 W/cm$^2$, preferably 0.5–4 W/cm$^2$, and more preferably 0.7–3 W/cm$^2$. The flow rate of $O_2$ is 0–10 parts with respect to 100 parts of the flow rate of the inert gas, preferably 0–5, and more preferably 0–2. The pressure in the deposition chamber upon film formation is 0.5–50 mTorr, preferably 1–30 mTorr, and more preferably 2–20 mTorr. Similarly, in the latter (Zn=53 to 60%) case, the amount of sputtering power per unit area of the target is 1–10 W/cm$^2$, preferably 1–7 W/cm$^2$, and more preferably 1–5 W/cm$^2$. Preferred ranges of the flow rate of $O_2$ during film formation and the pressure in the deposition chamber are the same as those in the case of the former type targets.

The DC magnetron sputter process is now described as an example. In FIG. 2, numeral 201 denotes the deposition chamber, which is evacuated by an exhaust pump (not shown). Inside the chamber, $H_2O$ and an inert gas such as argon (Ar) are introduced at predetermined flow rates to achieve a desired mixture ratio through the gas inlet pipes 202a, 202b connected to respective gas tanks (not shown), and the opening of the exhaust valve 203 is adjusted to keep the inside of the deposition chamber 201 at a predetermined pressure. The substrate 204 having a flat metal layer on the surface is fixed to the surface of the anode 206, in which the heater 205 is installed. Disposed opposite to the anode 206 is the cathode electrode 208, to the surface of which the target 207 is fixed and in which a magnet (not shown) is provided. The target 207 includes the metal component of zinc oxide, i.e., Zn at a percent of 53 to 60 (R=1.06 to 1.2). The cathode electrode is connected to the power supply 209. The power supply 209 applies a high voltage of direct current (DC) to produce plasma 210 between the cathode and the anode.

The plasma causes the zinc oxide of target 207 to be deposited on the substrate 204.

The light transmittance of the transparent oxide with fine asperities on the surface thus obtained by the above process is generally preferred to be as high as possible in order to effectively utilize the incident light, but the transparent oxide does not have to be transparent to the light in the wavelength region absorbed by the semiconductor. Rather, it is better for the transparent oxide to have a resistance for minimizing electric current due to a pinhole. On the other hand, the effect of series resistance loss due to the above resistance on the conversion efficiency of the solar cell must be within a negligible range. From such a point of view, the range of resistance per unit area (1 cm$^2$) is preferably from $10^{-6}$ to 10 Ω, more preferably from $10^{-5}$ to 3 Ω, and most preferably from $10^{-4}$ to 1 Ω. The preferred film thickness of the transparent oxide is as thin as possible in respect of transparency, but in order to obtain the texture structure with a high light trapping effect, the average film thickness is preferably not less than 100 nm. Also, in some cases, greater film thicknesses are required in respect of reliability.

A conceivable reason for the occurrence of optical confinement by the texture structure is scattering of light at the metal layer when the metal layer itself has the texture structure. If the metal layer is flat but the transparent oxide has the texture structure, the major reason is scattering due to phase shifts of incident light between recesses and projections at the surface of semiconductor and/or the interface with the transparent oxide. The pitch is preferably about 300–2000 nm, more preferably 400–1500 nm, and the difference in height is preferably 50–2000 nm, more preferably 70–1000 nm. If the surface of semiconductor assumes a similar texture structure to the transparent layer, scattering of light due to phase difference of light occurs easily, thus enhancing the effect of light trapping.

Further, formation of the transparent oxide of the present invention can prevent oxidation of the metal or alloy base layer even if it contains, for example, a large quantity of $H_2O$, $O_2$, or $O_3$ as a reactive gas. Addition of $O_2$ gas into the atmosphere upon formation of the transparent oxide has an effect of smoothing edges of the texture structure, which decreases recombination centers so as to improve the fill factor, resulting in improvement of the conversion efficiency. It can also prevent oxidation upon high-temperature film formation in the next step.

The present invention will be explained in more detail with specific examples.

EXAMPLE 1

Figure 5:
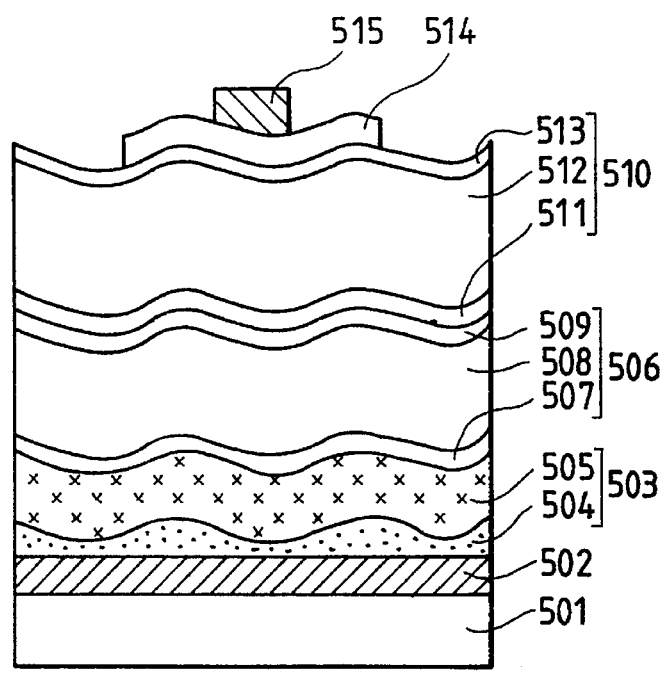
FIG. 5 is a diagrammatic cross sectional view showing another example of a photovoltaic element of the present invention.

In this example, the solar cell shown in FIG. 5 was fabricated.

Figure 4:
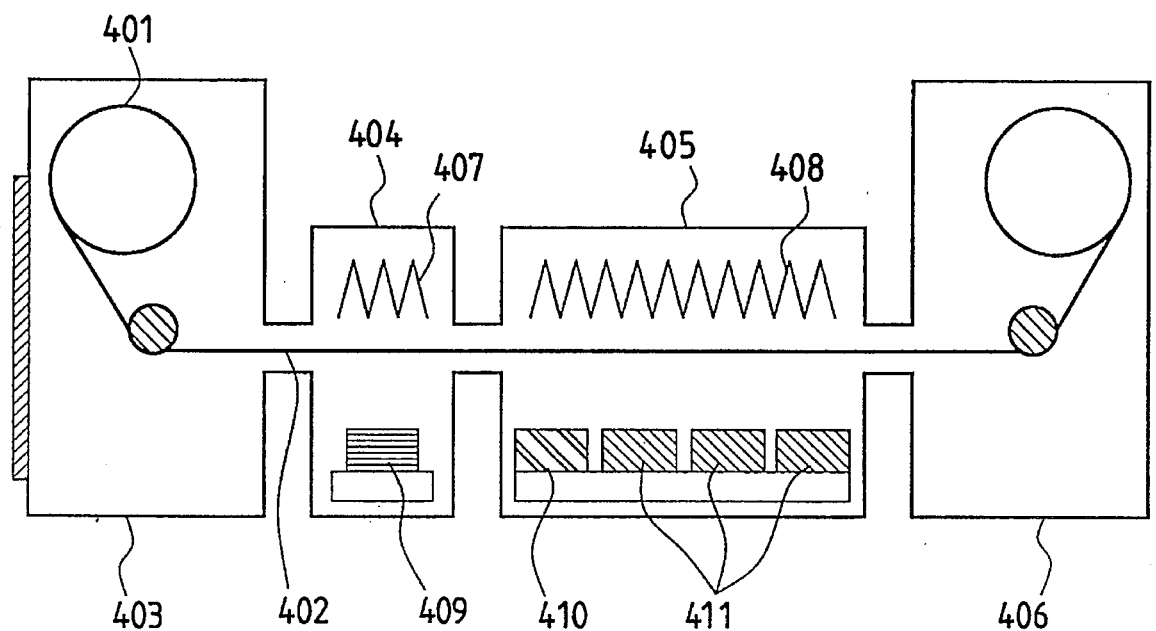
FIG. 4 is a diagrammatic drawing showing a sputtering apparatus of a roll-to-roll type suitable for fabrication of the back reflector layer of the present invention.

First, the back reflector layer was continuously formed using the apparatus shown in FIG. 4. Here, a roll 401 of stainless-steel sheet 402 (350 mm wide, 0.2 mm thick, and 500 m long) is cleaned and installed in a substrate feed chamber 403. From this chamber, the stainless-steel sheet 402 is fed through a metal-layer deposition chamber 404 and a transparent-oxide-layer deposition chamber 405 to a substrate winding chamber 406. The sheet 402 is arranged to be heated to a desired temperature by a respective substrate heater 407, 408 in each deposition chamber. The target 409 in the deposition chamber 404 is Ag of 99.99% purity, and an Ag layer 502 is deposited on the sheet 402 by the DC magnetron sputtering method.

Target 410 in the deposition chamber 405 is zinc oxide of 99.5% purity having a composition ratio of zinc and oxygen of 56:44 (corresponding to Zn of 1.12 times the stoichiometric composition), and a first transparent oxide layer 504 is deposited on the Ag layer 502 by the DC magnetron sputtering method. Target 411 is zinc oxide (Zn:O=50:50) of 99.5% purity, and a second transparent oxide layer 505 is deposited on the first transparent oxide layer 504 by the DC magnetron sputtering method. The target 411 includes three targets as required from the relation of deposition rate and desired film thickness.

The back reflector layer was formed using this apparatus. Setting the feed speed of sheet 402 at 20 cm/min, the substrate temperature upon deposition of the transparent layer was adjusted to 100° C., using only the substrate heater 408. $H_2O$ and Ar gases were introduced from gas introducing means (not shown) to achieve a ratio of $H_2O$:Ar=1:1 and a pressure of 3.0 mTorr, and a DC voltage of 500 V was applied to each cathode target. A current of 6 A flowed through the target 409, and a current of 4 A flowed through each of the targets 410, 411. The thickness of Ag was 60 nm, the thickness of the first and second transparent oxide layers was 800 nm on average, and the surface of the transparent oxides was slightly opaque. It was determined by a scanning probe microscope that the thickness of the first transparent oxide 504 was 10 nm.

On the transparent oxide, a bottom cell 506 with a pin semiconductor junction and a top cell 510 with a pin semiconductor junction were successively formed using a roll-to-roll type film-forming apparatus similar to the one as described in U.S. Pat. No. 4,492,181. Here, numerals 507 and 511 are a-Si layers with n-type conductivity, 509 and 513 µc-Si layers with p-type conductivity, 508 is an i-type a-SiGe layer, and 512 an i-type a-Si layer.

Subsequently, a transparent electrode 514 was deposited by the sputtering apparatus similar to the one shown in FIG. 4. The edges of the transparent electrode were subjected to patterning in order to prevent short-circuit in the subsequent steps. Further, a collector electrode 515 was formed, and thereafter the sheet 402 was cut to obtain the substrate 501. A mass-production effect was achieved by successive processing of the entire steps in this manner.

A hundred samples were fabricated by this method and were subjected to evaluation of characteristics under light irradiation of AM 1.5 (100 mW/cm$^2$). Photoelectric conversions efficiencies obtained were 11.0±0.3% and excellent conversion efficiencies were obtained with good reproducibility. After these solar cells were left under an environment of 50° C. temperature and 90% humidity for 1000 hours, the conversion efficiencies showed little degradation (10.4±0.6%). Another hundred samples were fabricated in the same manner by this method, and were subjected to irradiation for 600 hours with light equivalent to AM 1.5 in an open circuit state. Conversion efficiencies obtained showed little degradation due to the light (10.1.±0.4%).

As described above, a solar cell with high conversion efficiency and high reliability was achieved by the effect of the back reflector layer of the present invention.

EXAMPLE 2

Ten samples were produced in the same manner as in Example 1 except that $O_2$ was further introduced at 2 sccm during deposition of the transparent oxide.

The solar cells were subjected to evaluation of characteristics under light irradiation of AM 1.5 (100 mW/cm$^2$), and excellent conversion efficiencies were obtained (11.5%±0.3%). The fill factors were significantly improved. Observing the back reflector layers of the samples by SEM, the edges of the texture of transparent layer were smoothed. This seems to decrease the recombination between electrons and holes, likely to occur at edge portions.

EXAMPLE 3

A back reflector layer was formed by the same method as in Example 1. Then Cu was deposited in a thickness of 0.2 µm by the sputtering method on the substrate on which the back reflector layer was formed, and indium (In) was deposited thereon in 0.4 µm. Then this sample was transferred into a quartz glass bell jar, and hydrogen selenide ($H_2Se$) diluted to 10% with hydrogen was introduced into the bell jar with heating at 400° C., thereby forming a thin film of $CuInSi_2$ (CIS). On this film a layer of CdS was deposited in a thickness of 0.1 µm by the sputtering method, and thereafter the resultant was annealed at 250° C. to form a pn junction. On this junction a transparent electrode and a collector electrode were formed in the same manner as in Example 1.

This solar cell was subjected to evaluation of characteristics under light irradiation of AM 1.5 (100 mW/cm$^2$), and an excellent conversion efficiency was obtained (9.3%). This confirmed that the fabrication process of the present invention was also effective to thin-film semiconductors other than a-Si.

As detailed above, the present invention can prevent a reduction of reflectivity due to oxidation of the reflective metal layer, and thus can obtain a transparent oxide having the texture structure effective to cause an increase in conversion efficiency. Also, the metal atoms of the reflective layer are unlikely to diffuse into the semiconductor film, and an appropriate electric resistance suppresses leakage current even with a partially short-circuited portion in the semiconductor, thus achieving a photovoltaic element with high reliability. Further, the back reflector layer of this type can be fabricated at least in part by a method suitable for mass production, such as the roll-to-roll method.

Thus, the present invention will contribute greatly to widespread use of the solar-electric power generation.

What is claimed is:

1. A back reflector layer comprising a base layer made of a metal or alloy as a first metal, and a transparent oxide layer comprising a second metal and formed on said first metal, wherein the electron affinity of said second metal is at least 0.46 eV smaller than that of said first metal and wherein said transparent oxide layer is formed by a sputtering method in an atmosphere comprising at least H$_2$O and an inert gas and with a target having a composition ratio of said second metal of 1.06 to 1.2 times the stoichiometric composition thereof.

2. The back reflector layer according to claim 1, wherein the thickness of said transparent oxide layer is from 5 nm to 20 nm.

3. The back reflector layer according to claim 1, wherein a second transparent oxide layer is formed on said transparent oxide layer by a sputtering method using a target with a composition ratio of said second metal of 0.96 to 1.04 times the stoichiometric composition thereof.

4. A photovoltaic element comprising a semiconductor junction containing layer formed on the back reflector layer as set forth in any one of claims 1 to 3.

5. The back reflector layer according to claim 1, wherein said second metal is zinc.

6. The back reflector layer according to claim 5, wherein said first metal is a metal selected from the group consisting of aluminum, copper, and silver.

7. The back reflector layer according to claim 1, wherein said second metal is indium.

8. The back reflector layer according to claim 7, wherein said first metal is a metal selected from the group consisting of copper and silver.

9. The back reflector layer according to claim 1, wherein said first metal is a metal selected from the group consisting of aluminum, copper, and silver.

10. A method for forming a back reflector layer, comprising forming on a metal or alloy base layer as a first metal a transparent oxide layer comprising a second metal having an electron affinity of at least 0.46 eV smaller than that of said first metal, wherein said transparent oxide layer is formed by a sputtering method in an atmosphere comprising at least H$_2$O and an inert gas and with a target having a composition ratio of said second metal of 1.06 to 1.2 times the stoichiometric composition thereof.

11. The method for forming a back reflector layer according to claim 10, wherein the thickness of said transparent oxide layer is from 5 nm to 20 nm.

12. The method for forming a back reflector layer according to claim 10, further comprising, after formation of said transparent oxide layer, forming another transparent oxide layer thereon using a target having a composition ratio of said second metal of 0.96 to 1.04 times the stoichiometric composition.

13. The method for forming a back reflector layer according to claim 10, wherein an oxygen containing gas is added to said atmosphere.

14. A process for fabricating a photovoltaic element, further comprising forming a semiconductor junction containing layer on the back reflector layer as formed in any one of claims 10 to 13.

15. The method for forming a back reflector layer according to claim 10, wherein said second metal is zinc.

16. The back reflector layer according to claim 15, wherein said first metal is a metal selected from the group consisting of aluminum, copper, and silver.

17. The method for forming a back reflector layer according to claim 10, wherein said second metal is indium.

18. The method for forming a back reflector layer according to claim 17, wherein said first metal is a metal selected from the group consisting of copper and silver.

19. The method for forming a back reflector layer according to claim 10, wherein said first metal is a metal selected from the group consisting of aluminum, copper, and silver.

* * * * *

UNITED STATES PATENT AND TRADEMARK OFFICE
CERTIFICATE OF CORRECTION

PATENT NO. : 5,620,530
DATED : April 15, 1997
INVENTOR(S) : AKIYA NAKAYAMA

It is certified that error appears in the above-identified patent and that said Letters Patent is hereby corrected as shown below:

COLUMN 1

Line 55, "cells. enhancing" should read --cells. One idea is to provide a back reflector layer for enhancing--.

COLUMN 2

Line 30, "solar" should read --the solar--.

COLUMN 3

Line 6, "or" should be deleted.

COLUMN 4

Line 10, "cross sectional" should read --cross-sectional--.

COLUMN 5

Line 10, "to" should read --too--.
Line 12, ""antioxidation"" should read --"antioxidation",--.

COLUMN 6

Line 58, "call" should read --cell--.

UNITED STATES PATENT AND TRADEMARK OFFICE
CERTIFICATE OF CORRECTION

PATENT NO. : 5,620,530
DATED : April 15, 1997
INVENTOR(S) : AKIYA NAKAYAMA

It is certified that error appears in the above-identified patent and that said Letters Patent is hereby corrected as shown below:

COLUMN 8

Table 3, line 43, "reflectivity" should read
    --reflectivity (%)--.

COLUMN 9

Line 10, "temperature" should read --temperature of--.
  Line 14, "70%" should read --70%,--.
  Line 15, "x" should read --X--.
  Line 59, "(i.e." should read --(i.e.,--.

COLUMN 10

Line 32, "or" should read --of--.

COLUMN 12

Line 1, "ling" should read --long--.

COLUMN 14

Line 22, "sions" should read --sion--.
  Line 31, "(10.1." should read --(10.1--.

UNITED STATES PATENT AND TRADEMARK OFFICE
CERTIFICATE OF CORRECTION

PATENT NO. : 5,620,530
DATED : April 15, 1997
INVENTOR(S) : AKIYA NAKAYAMA

It is certified that error appears in the above-identified patent and that said Letters Patent is hereby corrected as shown below:

COLUMN 15

Line 5, "to" should read --for--.

COLUMN 16

Line 34, "The" should read --The method for forming a--.

Signed and Sealed this

Seventeenth Day of February, 1998

Attest:

BRUCE LEHMAN

Attesting Officer        Commissioner of Patents and Trademarks